(12) United States Patent
Hsu

(10) Patent No.: US 8,093,509 B2
(45) Date of Patent: Jan. 10, 2012

(54) FLEXIBLE THIN IMAGE-SENSING MODULE WITH ANTI-EMI FUNCTION AND FLEXIBLE THIN PCB MODULE WITH ANTI-EMI FUNCTION

(75) Inventor: Chi-Hsing Hsu, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 408 days.

(21) Appl. No.: 12/457,347

(22) Filed: Jun. 9, 2009

(65) Prior Publication Data
US 2010/0258343 A1 Oct. 14, 2010

(30) Foreign Application Priority Data
Apr. 8, 2009 (TW) ................ 98111647 A

(51) Int. Cl.
*H05K 9/00* (2006.01)
(52) U.S. Cl. .................. 174/378; 174/254; 361/818
(58) Field of Classification Search .......... 174/378, 174/254; 361/816, 818
See application file for complete search history.

(56) References Cited

U.S. PATENT DOCUMENTS

| | | | | |
|---|---|---|---|---|
| 5,519,585 A * | 5/1996 | Jones et al. | .................... | 361/818 |
| 5,527,989 A * | 6/1996 | Leeb | .............................. | 174/378 |
| 5,917,149 A * | 6/1999 | Barcley et al. | ................ | 174/378 |
| 6,600,663 B1 * | 7/2003 | Koleda | .......................... | 361/816 |
| 2002/0166680 A1* | 11/2002 | Mazurkiewicz | .............. | 174/350 |
| 2007/0119620 A1* | 5/2007 | Rodriguez et al. | ............. | 174/378 |
| 2009/0188712 A1* | 7/2009 | Clark et al. | .................... | 174/378 |
| 2009/0229876 A1* | 9/2009 | Takahashi | ...................... | 174/378 |

* cited by examiner

*Primary Examiner* — Hung Ngo
(74) *Attorney, Agent, or Firm* — Rosenberg, Klein & Lee

(57) ABSTRACT

A flexible thin image-sensing module with anti-EMI function includes a flexible substrate unit, an electronic element unit, an anti-EMI unit, and a conductive structure. The electronic element unit has a plurality of electronic elements disposed on a top surface of the flexible substrate unit, and the electronic elements at least include an image sensor, a low dropout regulator and a backend IC. The anti-EMI unit is disposed on a bottom surface of the flexible substrate unit. The conductive structure passes through the flexible substrate unit and is electrically connected between the electronic element unit and the anti-EMI unit in order to guide electromagnetic waves generated by the electronic element unit to the anti-EMI unit.

20 Claims, 5 Drawing Sheets

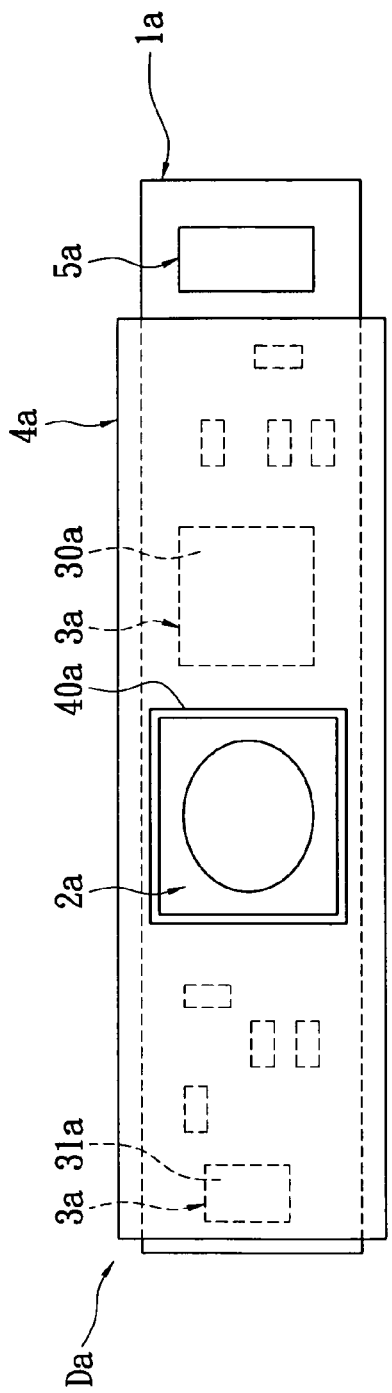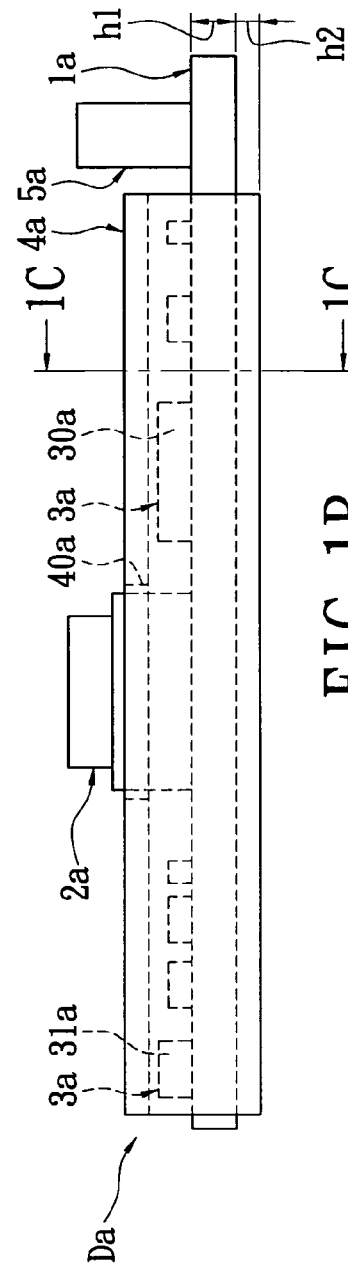
FIG. 1A
PRIOR ART
FIG. 1B
PRIOR ART

FLEXIBLE THIN IMAGE-SENSING MODULE WITH ANTI-EMI FUNCTION AND FLEXIBLE THIN PCB MODULE WITH ANTI-EMI FUNCTION

BACKGROUND OF THE INVENTION

1. Field of the Invention

The present invention relates to a flexible thin image-sensing module and a flexible thin PCB module, in particular, to a flexible thin image-sensing module with anti-EMI function and a flexible thin PCB module with anti-EMI function.

2. Description of Related Art

The advantage of CMOS (Complementary Metal-Oxide-Semiconductor) is low power consumption and small size, so that the CMOS image-sensing chip package module can integrate into small portable electronic devices such as mobile phone and notebook.

Referring to FIGS. 1A to 1D, the prior art provides an image-sensing module Da, including: a hard substrate 1a, an image sensor 2a, a plurality of electronic elements 3a, an anti-EMI (Electromagnetic Interference) element 4a, and a USB connector 5a. The image sensor 2a and the electronic elements 3a are electrically disposed on the hard substrate 1a. The image sensor 2a is exposed by the first opening 40a of the anti-EMI element 4a, and the hard substrate 1a and the electronic elements 3a are encircled by the anti-EMI element 4a. Hence, the thickness h1 of the hard substrate 1a and the thickness h2 of the anti-EMI element 4a cannot be reduced, so the overall thickness of the image-sensing module Da of the prior art cannot be reduced.

Moreover, the electronic elements 3a at least include: an LDO (Low Dropout) regulator 30a and a backend IC 31a. The LDO regulator 30a is disposed between the USB connector 5a and the image sensor 2a and is electrically connected to the USB connector 5a. The backend IC 31a is far away from the LDO regulator 30a and is electrically connected to one side of the image sensor 2a.

Referring to FIG. 1D, the image-sensing module Da is usually applied to a notebook Na. For example, the image-sensing module Da is installed in a front side of a top cover Ca of the notebook Na for user to use it. However, the thickness of the image-sensing module Da of the prior art can not be reduced, so that the front side of the top cover Ca can be designed as an arc shape only. Hence, the whole feeling thickness of the notebook Na can not be reduced due to the arc shape formed on the front side of the top cover Ca.

Hence, the image-sensing module Da of the prior art has the following defects:

1. Because the thickness of the hard substrate 1a is large, the thickness of the image-sensing module Da cannot be reduced.

2. The image-sensing module Da needs to use the anti-EMI element 4a to prevent the electronic elements 3a from being affected by electromagnetic interference, so that the thickness of the image-sensing module Da cannot be reduced.

3. The hard substrate 1a is made of hard material, so that the hard substrate 1a is cracked easily when assembling the image-sensing module Da. In addition, the prior art has provided a way to prevent the hard substrate 1a from being cracked easily, and the way is to increase the thickness of the hard substrate 1a. However, this way would increase the cost and increase the whole thickness of the image-sensing module Da.

4. If the anti-EMI element 4a wants to achieve anti-EMI effect, the anti-EMI element 4a needs to mate with conductive glue.

Hence, it is very important for designer to design a CMOS image-sensing chip package module of reduced thickness in order to integrate it into a portable electronic device (such as notebook) of small thickness according to different market requirements.

SUMMARY OF THE INVENTION

In view of the aforementioned issues, the present invention provides a flexible thin image-sensing module with anti-EMI function. The whole thickness of the flexible thin image-sensing module can be reduced, and the flexible thin image-sensing module does not be cracked easily when assembling the flexible thin image-sensing module.

In view of the aforementioned issues, the present invention provides a flexible thin PCB module with anti-EMI function. The whole thickness of the flexible thin PCB module can be reduced, and the flexible thin PCB module does not be cracked easily when assembling the flexible thin PCB module.

To achieve the above-mentioned objectives, the present invention provides a flexible thin image-sensing module with anti-EMI function, including: a flexible substrate unit, a first conductive unit, a protection unit, an anti-EMI unit, a second conductive unit, an electronic element unit, and a third conductive unit. The flexible substrate unit has at least one through hole. The first conductive unit has a first conductive layer disposed on a bottom surface of the flexible substrate unit, a second conductive layer disposed on a top surface of the flexible substrate unit, and a third conductive layer disposed on an inner surface of the through hole and electrically connected between the first conductive layer and the second conductive layer. The protection unit has a first adhesive layer disposed on the first conductive layer, a first covering layer disposed on the first adhesive layer, a second adhesive layer disposed on the second conductive layer, and a second covering layer disposed on the second adhesive layer. The protection unit has at least one first hole passing through the first adhesive layer and the first covering layer and a plurality of second holes passing through the second adhesive layer and the second covering layer. The anti-EMI unit is disposed on the first covering layer. The second conductive unit has a first conductive body filling out the first hole, and the first conductive body is electrically connected between the first conductive layer and the anti-EMI unit. The electronic element unit has a plurality of electronic elements disposed on the second covering layer, and one of the electronic elements is an image sensor. The third conductive unit has a plurality of second conductive bodies respectively filling out the second holes, and the second conductive bodies are electrically connected between the second conductive layer and the electronic element unit.

To achieve the above-mentioned objectives, the present invention provides a flexible thin image-sensing module with anti-EMI function, including: a flexible substrate unit, an electronic element unit, an anti-EMI unit, and a conductive structure. The electronic element unit has a plurality of electronic elements disposed on a top surface of the flexible substrate unit, and the electronic elements at least include an image sensor, a low dropout regulator and a backend IC. The anti-EMI unit is disposed on a bottom surface of the flexible substrate unit. The conductive structure passes through the flexible substrate unit and is electrically connected between the electronic element unit and the anti-EMI unit in order to guide electromagnetic waves generated by the electronic element unit to the anti-EMI unit.

To achieve the above-mentioned objectives, the present invention provides a flexible thin PCB module with anti-EMI function, including: a flexible substrate unit, an electronic element unit, an anti-EMI unit, and a conductive structure. The electronic element unit has a plurality of electronic elements disposed on a top surface of the flexible substrate unit. The anti-EMI unit is disposed on a bottom surface of the flexible substrate unit. The conductive structure passes through the flexible substrate unit and is electrically connected between the electronic element unit and the anti-EMI unit in order to guide electromagnetic waves generated by the electronic element unit to the anti-EMI unit.

Therefore, the anti-EMI unit is disposed on the bottom surface of the flexible substrate unit, and the anti-EMI unit can be a grounding film for guiding electromagnetic waves generated by the electronic element unit to the anti-EMI unit in order to decrease the electromagnetic interference of the electronic element unit. The anti-EMI unit is disposed on the bottom surface of the flexible substrate unit, so that the whole feeling thickness of the flexible thin image-sensing module is reduced. The flexible thin image-sensing module and the flexible thin PCB module are flexible, so that the flexible thin image-sensing module and the flexible thin PCB module do not be cracked easily when assembling the flexible thin image-sensing module and the flexible thin PCB module.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

BRIEF DESCRIPTION OF THE DRAWINGS

FIG. 1A is a top, schematic view of the image-sensing module of the prior art;

FIG. 1B is a front, schematic view of the image-sensing module of the prior art;

DETAILED DESCRIPTION OF THE PREFERRED EMBODIMENTS

Figure 1C:
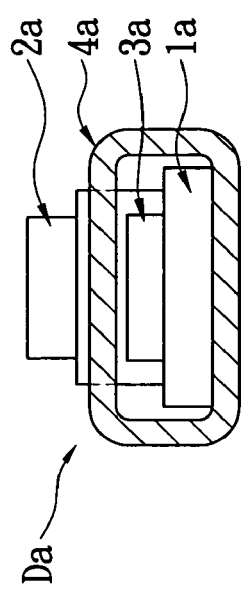
FIG. 1C is a cross-sectional, schematic view along line 1C-1C of the image-sensing module shown in FIG. 1B.
Figure 1D:
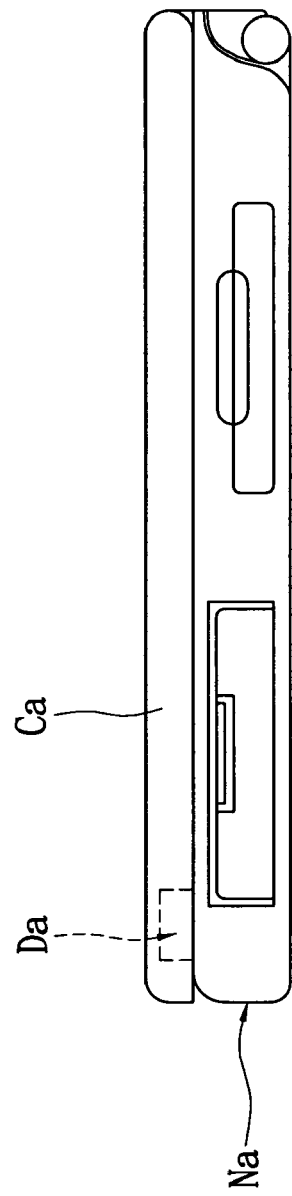
FIG. 1D is lateral, schematic view of the image-sensing module of the prior art applied to the notebook.
Figure 2:
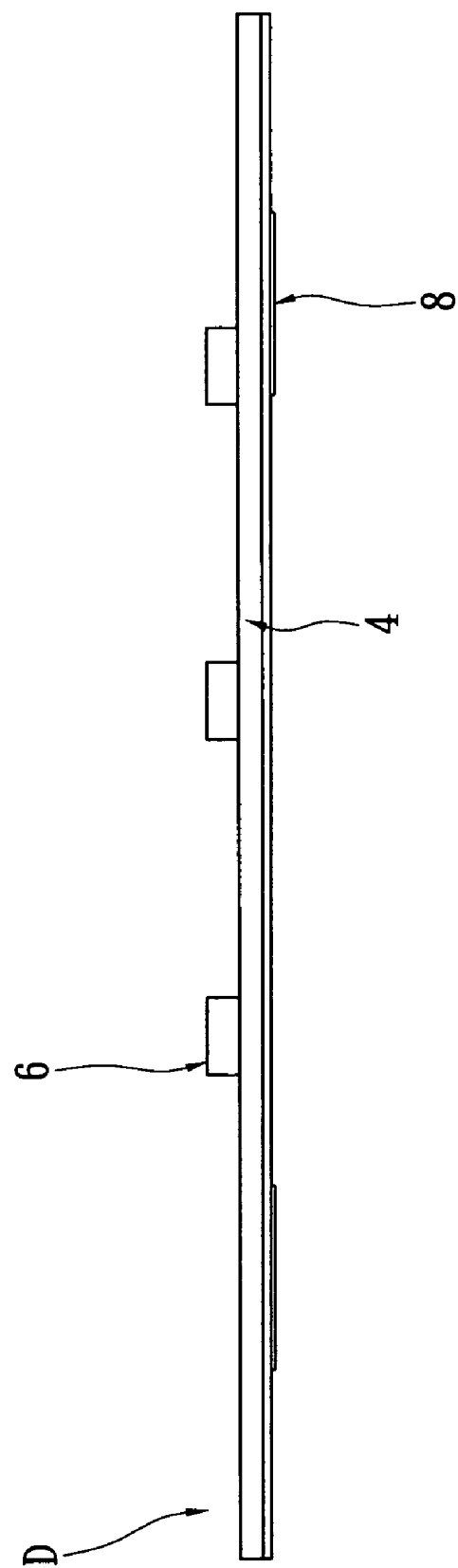
FIG. 2 is a lateral, schematic view of the flexible thin image-sensing module with anti-EMI function according to the present invention.
Figure 3:
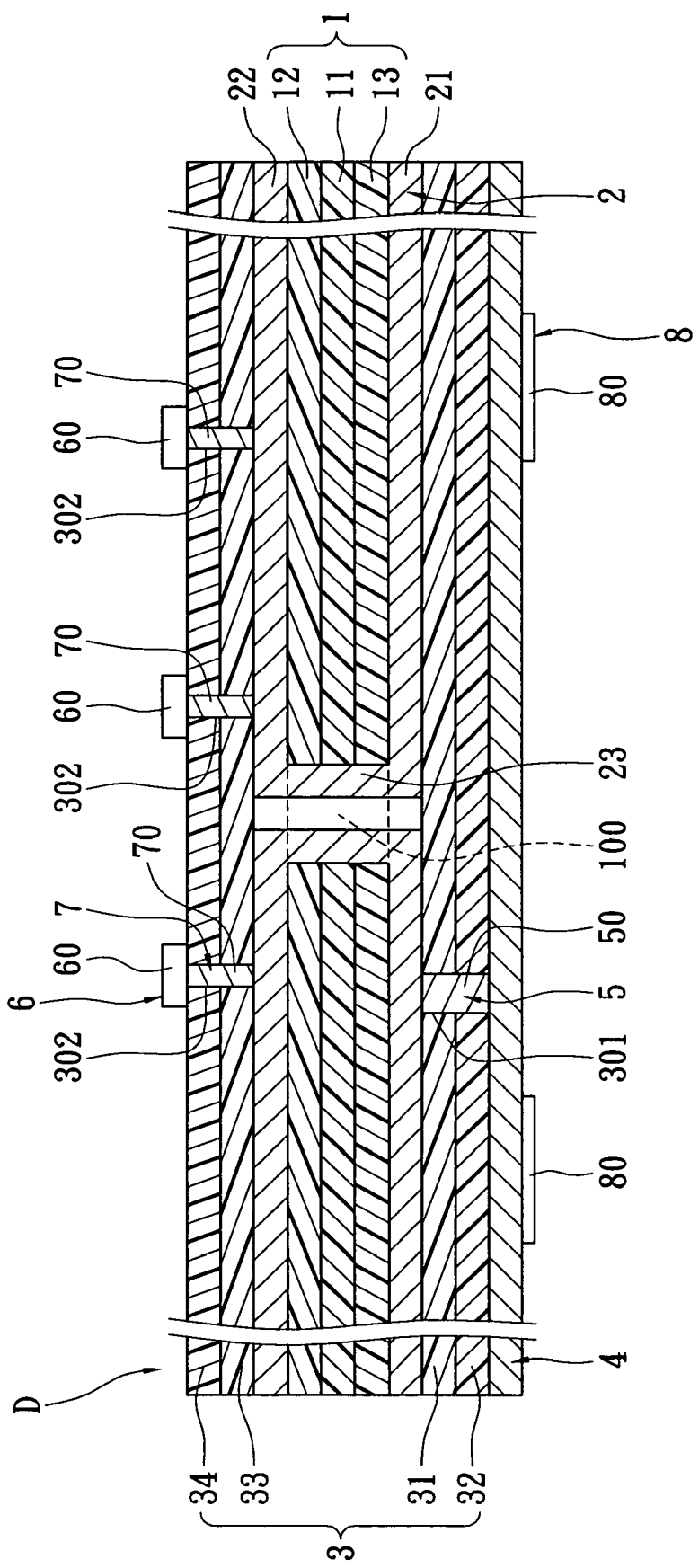
FIG. 3 is a lateral, cross-sectional, schematic view of the flexible thin image-sensing module with anti-EMI function according to the present invention.

Referring to FIGS. 2 and 3, the present invention provides a flexible thin image-sensing module D with anti-EMI (Anti Electromagnetic Interference) function, including: a flexible substrate unit 1, a first conductive unit 2, a protection unit 3, an anti-EMI unit 4, a second conductive unit 5, an electronic element unit 6, and a third conductive unit 7.

The flexible substrate unit 1 has at least one through hole 100. In the present invention, the flexible substrate unit 1 can be a flexible copper foil clad laminate (FCCL). For example, the flexible substrate unit 1 has a base film 11, a first base copper foil 12 disposed on a top surface of the base film 11 and a second base copper foil 13 disposed on a bottom surface of the base film 11, and the through hole 100 passes through the first base copper foil 12, the base film 11 and the second base copper foil 13. However, the FCCL is just an example, and it does not limit the present invention. Any elastic substrate or flexible substrate can be applied in the present invention.

Moreover, the first conductive unit 2 has a first conductive layer 21 disposed on a bottom surface of the flexible substrate unit 1, a second conductive layer 22 disposed on a top surface of the flexible substrate unit 1, and a third conductive layer 23 disposed on an inner surface of the through hole 100 and electrically connected between the first conductive layer 21 and the second conductive layer 22. In the present embodiment, the first conductive unit 2 can be an electrodeposited copper foil. The third conductive layer 23 also can completely fill out the through hole 100 according to different requirements.

Furthermore, the protection unit 3 has a first adhesive layer 31 disposed on the first conductive layer 21, a first covering layer 32 disposed on the first adhesive layer 31, a second adhesive layer 33 disposed on the second conductive layer 22, and a second covering layer 34 disposed on the second adhesive layer 33. In addition, the protection unit 3 has at least one first hole 301 passing through the first adhesive layer 31 and the first covering layer 32 and a plurality of second holes 302 passing through the second adhesive layer 33 and the second covering layer 34.

Moreover, the anti-EMI unit 4 is disposed on the first covering layer 32, and the anti-EMI unit 4 can be a grounding film for guiding electromagnetic waves generated by the electronic element unit 6 to the anti-EMI unit 4 in order to decrease the electromagnetic interference of the electronic element unit 6. Furthermore, the total thickness of the flexible substrate unit 1, the first conductive unit 2 and the anti-EMI unit 4 is between 0.1 mm and 0.35 mm. For example, 0.1 mm □ the total thickness<0.35 mm.

In addition, the second conductive unit 5 has a first conductive body 50 filling out the first hole 301, and the first conductive body 50 is electrically connected between the first conductive layer 21 of the first conductive unit 2 and the anti-EMI unit 4.

Moreover, the electronic element unit 6 has a plurality of electronic elements 60 disposed on the second covering layer 34, and the electronic elements at least comprise an image sensor, a low dropout (LDO) regulator and a backend IC. However, the above-mentioned electronic elements are just examples, and these do not limit the present invention.

Furthermore, the third conductive unit 7 has a plurality of second conductive bodies 70 respectively filling out the second holes 302, and the second conductive bodies 70 are electrically connected between the second conductive layer 22 of the first conductive unit 2 and the electronic element unit 6.

In addition, the present invention further includes an adhesive unit 8 that has a plurality of adhesive films 80 disposed on the anti-EMI unit 4. Each adhesive film 80 can be a film with adhesive function and without conductive function. Hence, the flexible thin image-sensing module D can be positioned on any object via the adhesive films 80.

Therefore, the present invention provides a flexible thin image-sensing module D with anti-EMI function, including: a flexible substrate unit 1, an electronic element unit 6, an anti-EMI unit 4 and a conductive structure. Moreover, the electronic element unit 6 has a plurality of electronic elements 60 disposed on a top surface of the flexible substrate unit 1, and the electronic elements 60 at least includes an image sensor, a low dropout regulator and a backend IC. The anti-EMI unit 4 is disposed on a bottom surface of the flexible substrate unit 1. The conductive structure is composed of a first conductive unit 2, a protection unit 3, a second conductive unit 5 and a third conductive unit 7, and the conductive structure passes through the flexible substrate unit 1 and is electrically connected between the electronic element unit 6 and the anti-EMI unit 4 in order to guide electromagnetic waves generated by the electronic element unit 6 to the anti-EMI unit 4.

If the types of the electronic elements 60 do not be limited, the present invention provides a flexible thin PCB module with anti-EMI function. The flexible thin PCB module can be applied to different fields according to the types of the electronic elements 60. Moreover, the flexible thin PCB module includes a flexible substrate unit 1, an electronic element unit 6, an anti-EMI unit 4 and a conductive structure. In addition, the electronic element unit 6 has a plurality of electronic elements 60 disposed on a top surface of the flexible substrate unit 1. The anti-EMI unit 4 is disposed on a bottom surface of the flexible substrate unit 1. The conductive structure is composed of a first conductive unit 2, a protection unit 3, a second conductive unit 5 and a third conductive unit 7, and the conductive structure passes through the flexible substrate unit 1 and is electrically connected between the electronic element unit 6 and the anti-EMI unit 4 in order to guide electromagnetic waves generated by the electronic element unit 6 to the anti-EMI unit 4.

Figure 4:
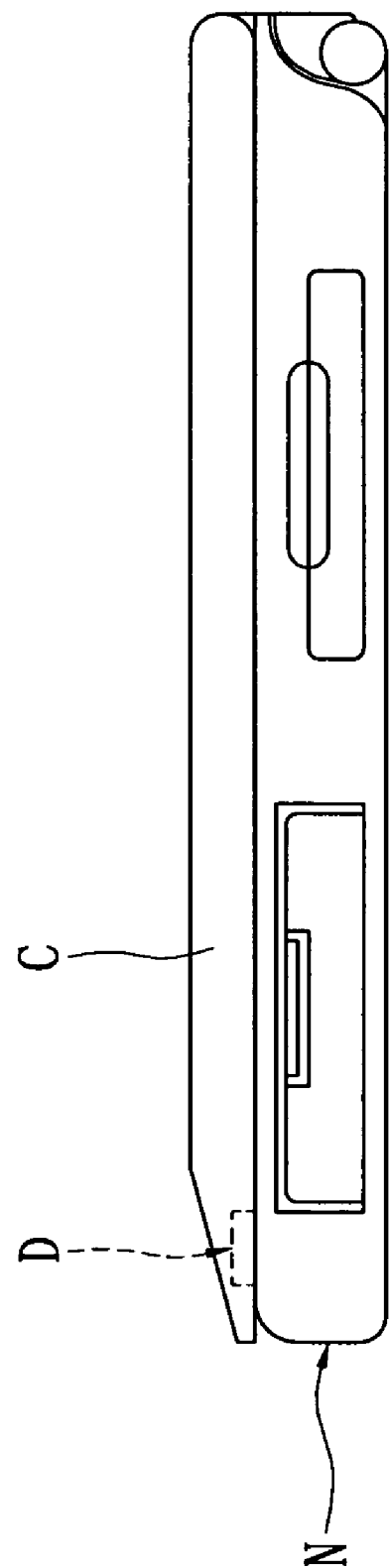
FIG. 4 is a lateral, schematic view of the flexible thin image-sensing module with anti-EMI function applied to the notebook according to the present invention.

Furthermore, referring to FIG. 4, when the flexible thin image-sensing module D is installed in a front side of a top cover C of a notebook N, the front side of the top cover C can be designed as an inclination shape due to the reduced thickness of the flexible thin image-sensing module D. Hence, the whole feeling thickness of the notebook N is reduced due to the inclination shape formed on the front side of the top cover C.

In conclusion, the present invention has the following advantages:

1. The anti-EMI unit 4 is disposed on the bottom surface of the flexible substrate unit 1, and the anti-EMI unit 4 can be a grounding film for guiding electromagnetic waves generated by the electronic element unit 6 to the anti-EMI unit 4 in order to decrease the electromagnetic interference of the electronic element unit 6.

2. The anti-EMI unit 4 is disposed on the bottom surface of the flexible substrate unit 1, so that the whole feeling thickness of the notebook N is reduced.

3. The flexible thin image-sensing module D and the flexible thin PCB module are flexible, so that the flexible thin image-sensing module D and the flexible thin PCB module do not be cracked easily when assembling the flexible thin image-sensing module D and the flexible thin PCB module.

4. The anti-EMI unit 4 can achieve anti-EMI effect without using conductive glue.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A flexible thin image-sensing module with anti-EMI function, comprising:
    a flexible substrate unit having at least one through hole;
    a first conductive unit having a first conductive layer disposed on a bottom surface of the flexible substrate unit, a second conductive layer disposed on a top surface of the flexible substrate unit, and a third conductive layer disposed on an inner surface of the through hole, and electrically connected between the first conductive layer and the second conductive layer;
    a protection unit having a first adhesive layer disposed on the first conductive layer, a first covering layer disposed on the first adhesive layer, a second adhesive layer disposed on the second conductive layer, and a second covering layer disposed on the second adhesive layer, wherein the protection unit has at least one first hole passing through the first adhesive layer and the first covering layer and a plurality of second holes passing through the second adhesive layer and the second covering layer;
    an anti-EMI unit disposed on the first covering layer;
    a second conductive unit having a first conductive body filling out the first hole, wherein the first conductive body is electrically connected between the first conductive layer and the anti-EMI unit;
    an electronic element unit having a plurality of electronic elements disposed on the second covering layer, wherein one of the electronic elements is an image sensor; and
    a third conductive unit having a plurality of second conductive bodies respectively filling out the second holes, wherein the second conductive bodies are electrically connected between the second conductive layer and the electronic element unit.

2. The flexible thin image-sensing module according to claim 1, wherein the flexible substrate unit is a flexible copper foil clad laminate and has a base film, a first base copper foil disposed on a top surface of the base film and a second base copper foil disposed on a bottom surface of the base film, and the through hole passes through the first base copper foil, the base film and the second base copper foil.

3. The flexible thin image-sensing module according to claim 1, wherein the total thickness of the flexible substrate unit, the first conductive unit and the anti-EMI unit is between 0.1 mm and 0.35 mm.

4. The flexible thin image-sensing module according to claim 1, wherein the first conductive unit is an electrodeposited copper foil.

5. The flexible thin image-sensing module according to claim 1, wherein the electronic elements at least comprise a low dropout regulator and a backend IC.

6. The flexible thin image-sensing module according to claim 1, wherein the anti-EMI unit is a grounding film.

7. The flexible thin image-sensing module according to claim 1, further comprising: an adhesive unit having a plurality of adhesive films disposed on the anti-EMI unit.

8. A flexible thin image-sensing module with anti-EMI function, comprising:
    a flexible substrate unit;
    an electronic element unit having a plurality of electronic elements disposed on a top surface of the flexible substrate unit, wherein the electronic elements at least comprise an image sensor, a low dropout regulator and a backend IC;
    an anti-EMI unit disposed on a bottom surface of the flexible substrate unit; and
    a conductive structure passing through the flexible substrate unit and electrically connected between the electronic element unit and the anti-EMI unit in order to guide electromagnetic waves generated by the electronic element unit to the anti-EMI unit.

9. The flexible thin image-sensing module according to claim 8, wherein the flexible substrate unit is a flexible copper foil clad laminate.

10. The flexible thin image-sensing module according to claim 8, wherein the flexible substrate unit has a base film, a first base copper foil disposed on a top surface of the base film, and a second base copper foil disposed on a bottom surface of the base film.

11. The flexible thin image-sensing module according to claim 10, wherein the flexible substrate unit has at least one through hole, and the through hole passes through the first base copper foil, the base film and the second base copper foil.

12. The flexible thin image-sensing module according to claim 11, wherein the conductive structure comprises:
   a first conductive unit having a first conductive layer disposed on a bottom surface of the flexible substrate unit, a second conductive layer disposed on a top surface of the flexible substrate unit, and a third conductive layer disposed on an inner surface of the through hole and electrically connected between the first conductive layer and the second conductive layer;
   a protection unit having a first adhesive layer disposed on the first conductive layer, a first covering layer disposed on the first adhesive layer, a second adhesive layer disposed on the second conductive layer, and a second covering layer disposed on the second adhesive layer, wherein the protection unit has at least one first hole passing through the first adhesive layer and the first covering layer and a plurality of second holes passing through the second adhesive layer and the second covering layer;
   a second conductive unit having a first conductive body filling out the first hole, wherein the first conductive body is electrically connected between the first conductive layer and the anti-EMI unit; and
   a third conductive unit having a plurality of second conductive bodies respectively filling out the second holes, wherein the second conductive bodies are electrically connected between the second conductive layer and the electronic element unit;
   wherein the anti-EMI unit is disposed on the first covering layer, and the electronic elements are disposed on the second covering layer.

13. The flexible thin image-sensing module according to claim 12, wherein the first conductive unit is an electrodeposited copper foil, and the anti-EMI unit is a grounding film.

14. The flexible thin image-sensing module according to claim 12, wherein the total thickness of the flexible substrate unit, the first conductive unit and the anti-EMI unit is between 0.1 mm and 0.35 mm.

15. The flexible thin image-sensing module according to claim 8, further comprising: an adhesive unit having a plurality of adhesive films disposed on the anti-EMI unit.

16. A flexible thin PCB module with anti-EMI function, comprising:
   a flexible substrate unit;
   an electronic element unit having a plurality of electronic elements disposed on a top surface of the flexible substrate unit;
   an anti-EMI unit disposed on a bottom surface of the flexible substrate unit; and
   a conductive structure passing through the flexible substrate unit and electrically connected between the electronic element unit and the anti-EMI unit in order to guide electromagnetic waves generated by the electronic element unit to the anti-EMI unit.

17. The flexible thin PCB module according to claim 16, wherein the flexible substrate unit is a flexible copper foil clad laminate, and the flexible substrate unit has a base film, a first base copper foil disposed on a top surface of the base film, and a second base copper foil disposed on a bottom surface of the base film.

18. The flexible thin PCB module according to claim 17, wherein the flexible substrate unit has at least one through hole, and the through hole passes through the first base copper foil, the base film and the second base copper foil.

19. The flexible thin PCB module according to claim 18, wherein the conductive structure comprises:
   a first conductive unit having a first conductive layer disposed on a bottom surface of the flexible substrate unit, a second conductive layer disposed on a top surface of the flexible substrate unit, and a third conductive layer disposed on an inner surface of the through hole and electrically connected between the first conductive layer and the second conductive layer;
   a protection unit having a first adhesive layer disposed on the first conductive layer, a first covering layer disposed on the first adhesive layer, a second adhesive layer disposed on the second conductive layer, and a second covering layer disposed on the second adhesive layer, wherein the protection unit has at least one first hole passing through the first adhesive layer and the first covering layer and a plurality of second holes passing through the second adhesive layer and the second covering layer;
   a second conductive unit having a first conductive body filling out the first hole, wherein the first conductive body is electrically connected between the first conductive layer and the anti-EMI unit; and
   a third conductive unit having a plurality of second conductive bodies respectively filling out the second holes, wherein the second conductive bodies are electrically connected between the second conductive layer and the electronic element unit;
   wherein the anti-EMI unit is disposed on the first covering layer, and the electronic elements are disposed on the second covering layer.

20. The flexible thin PCB module according to claim 8, further comprising: an adhesive unit having a plurality of adhesive films disposed on the anti-EMI unit, and the total thickness of the flexible substrate unit, the first conductive unit and the anti-EMI unit is between 0.1 mm and 0.35 mm.

* * * * *